United States Patent [19]

Kuo et al.

[11] 4,258,466

[45] Mar. 31, 1981

[54] HIGH DENSITY ELECTRICALLY PROGRAMMABLE ROM

[75] Inventors: Chang-Kiang Kuo, Houston; Shyh-Chang Tsaur, Stafford, both of Tex.

[73] Assignee: Texas Instruments Incorporated, Dallas, Tex.

[21] Appl. No.: 957,518

[22] Filed: Nov. 2, 1978

[51] Int. Cl.³ ............................................ B01J 17/00
[52] U.S. Cl. .................................. 29/571; 29/577 R; 29/578; 29/591; 357/45; 357/59
[58] Field of Search ................. 29/571, 577, 578, 591; 357/45, 59

[56] References Cited

U.S. PATENT DOCUMENTS

| | | | |
|---|---|---|---|
| 4,142,926 | 3/1979 | Morgan | 29/571 |
| 4,180,826 | 12/1979 | Shappir | 357/45 |
| 4,183,040 | 1/1980 | Rideout | 357/59 |

*Primary Examiner*—W. C. Tupman
*Attorney, Agent, or Firm*—John G. Graham

[57] ABSTRACT

An electrically programmable memory array of the floating gate type is made by a process which allows the edges of the floating gates to be aligned with the edges of the control gates which also form address lines. Contacts to individual cells are not needed. These factors provide a very small cell size. The source and drain regions are formed prior to applying the first level polysilicon then covered with thick oxide, rather than using the polysilicon as a mask to define the gate areas.

7 Claims, 11 Drawing Figures

HIGH DENSITY ELECTRICALLY PROGRAMMABLE ROM

BACKGROUND OF THE INVENTION

This invention relates to semiconductor memory devices and method of manufacture, and more particularly to an electrically progammable read only memory (EPROM) of the floating gate type.

Nonvolatile memory devices using a floating gate to retain charge are made by a double level polysilicon process as set forth in U.S. Pat. No. 4,122,544 issued to David J. McElroy and U.S. Pat. No. 4,112,509 issued to Lawrence S. Wall, both assigned to Texas Instruments, or in U.S. Pat. No. 3,984,822 issued to Simko et al. These devices are widely used in microcomputers, particularly in program development.

The cell size in prior floating gate EPROMs has been large due to the metal to polysilicon contacts needed for each cell or cell pair, and due to the excess overlap of the control gate over the floating gate needed to provide a larger control gate to floating gate capacitance then floating gate to source-drain capacitance and to assure proper alignment. These features were necessary because of the process used for manufacture. Smaller cell size is desirable in order to provide a more dense array with more cells in a given silicon area, and/or to lower cost and increase yields in manufacture.

It is the principal object of this invention to provide an improved electrically programmable memory. Another object is to provide an EPROM of reduced cell size. An additional object is to provide a dense array of EPROM cells, made by a more efficient method.

SUMMARY OF THE INVENTION

In accordance with an illustrative embodiment of the invention an electrically programmable memory array of the floating gate type is made by a process which allows the edges of the floating gates to be aligned with the edges of the control gates which also form address lines. Contacts to individual cells are not needed. These factors provide a very small cell size. The source and drain regions are formed prior to applying the first level polysilicon then covered with thick oxide, rather than using the polysilicon as a mask to define the gate areas.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 4a-14e are elevation views in section of the EPROM array and a transistor in the peripheral part of the semiconductor device of FIGS. 1 and 3a-3d, at successive stages in the manufacturing process, taken generally along the line a—a in FIG. 1.

DETAILED DESCRIPTION OF SPECIFIC EMBODIMENTS

Figure 1:
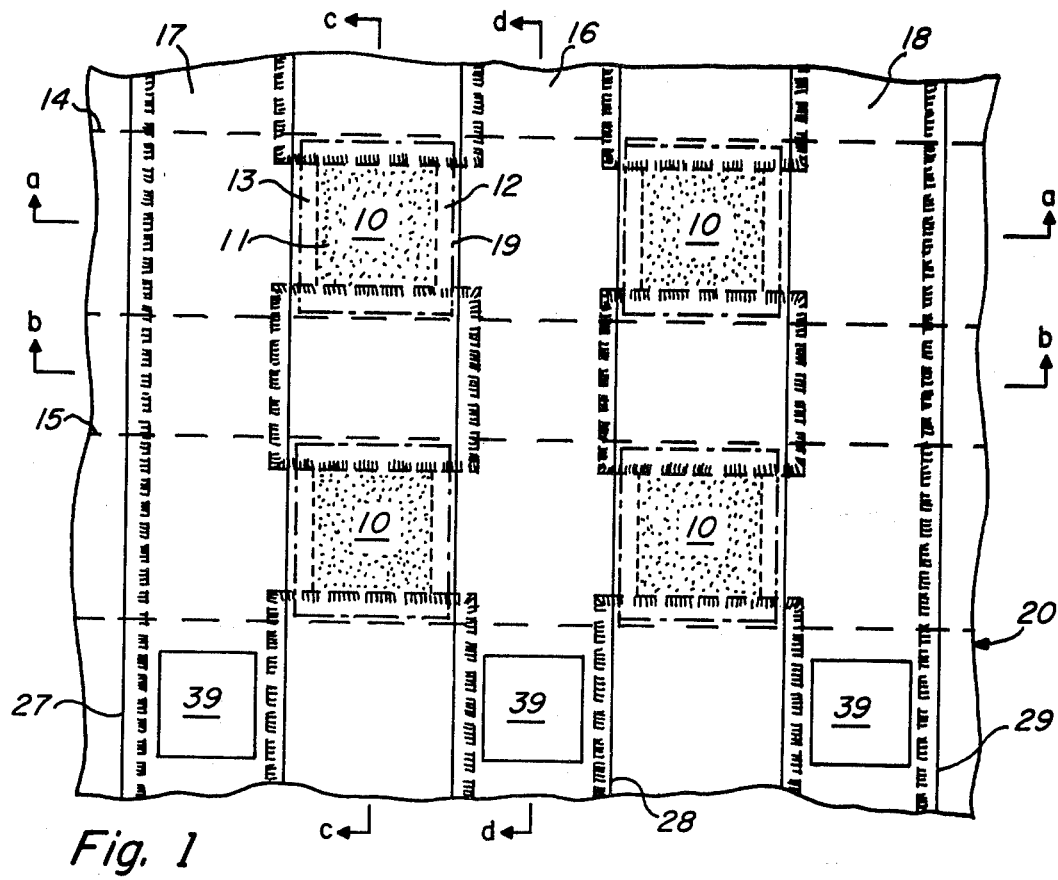
FIG. 1 is a greatly enlarged plan view of a small portion of a semiconductor chip showing the physical layout of a part of an EPROM array made according to the invention.
Figure 2:
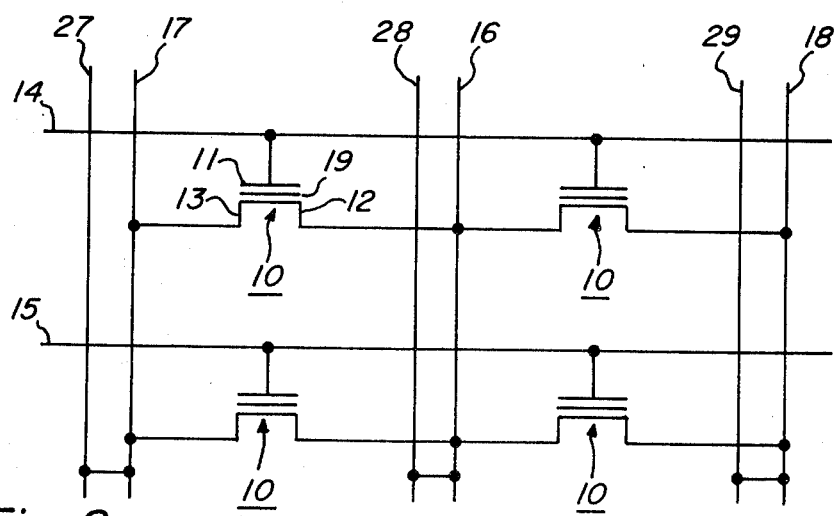
FIG. 2 is an electrical schematic diagram of the ROM of FIG. 1.

With reference to FIGS. 1, 2, and 3a-3d, an electrically programmable read only memory is illustrated which is made according to the invention. The array consists of a large number of cells 10, only four of which are shown. Each cell is an MOS transistor having a control gate 11, a source 12 and a drain 13. The gates 11 are parts of polysilicon strips 14 and 15 which are the X address lines for the array. The sources are part of an N+ diffused region 16 which is connected to ground or Vss, while the drains are part of N+ diffused regions 17 and 18 which are Y output lines. A floating gate 19 is interposed between the control gate 11 and the channel in each cell 10. A P+ tank 20' is provided in each channel area for optimum programming characteristics. The array, formed on a silicon bar 20, would typically contain perhaps 64 or 128K bits on a bar less than about 200 mils on a side or 40,000 square mil area depending upon the bit density. The four cells 10 shown would be on a minute part of the bar, perhaps about one mil wide. A 64K EPROM would require 256 of the X address lines such as 14 and 15 and 256 of the Y lines like the lines 17 and 18, providing 65,536 bits. Although one Vss line 16 is shown for two Y lines, the array could be of a virtual ground type as disclosed in U.S. Pat. No. 3,934,233, issued to Roger J. Fisher and Gerald D. Rogers or U.S. Pat. No. 4,021,781 issued to Edward R. Caudel, both assigned to Texas Instruments, in which case one Vss line for each eight or sixteen Y lines would be all that would be needed. Alternatively, the array could be of a virtual ground type wherein no dedicated ground lines are used, but instead one Y line is selected as an output and an adjacent one as ground, depending upon the Y address.

The cell array is programmed by injection of electrons into the floating gates 19 by application of high voltage to a selected one of the polycrystalline silicon strips 14 and 15 and one of the Y lines to raise the threshold voltage of the selected one of the cells 10 to a value above that which will be turned on by a logic level voltage on an address line 14, 15, etc.

A thin gate oxide layer 21 separates the floating gate 19 from the silicon surface, and another thin thermal oxide layer 22 separates the floating gate from the control gate 11 in each cell. A thick layer 23 of deposited oxide overlies the upper level of polysilicon. A thick field oxide coating 24 covers parts of the bar not occupied by the transistors or diffused interconnects, and P+ channel stop regions 25 are formed underneath all the thick field oxide. A thinner field oxide coating 26 covers the N+ diffused regions 16, 17, and 18.

In order to reduce the series resistance of the elongated conductive N+ regions 16, 17 and 18, metal strips 27, 28 and 29 overlie these regions and are connected to the regions periodically. For example, a metal-to-silicon contact may be made once every sixteen or thirty-two cells, depending upon the resistivity of the N+ regions. These metal strips are particularly important for programming where higher currents are used then for the read mode.

A cell 10 is programmed by holding its drain 13 and control gate 11 at a high voltage, typically +25 V DC, while the source 12 is at Vss. A large current flows in the channel, causing electrons of high energy state to traverse the gate oxide layer 21 and charge the floating gate 19. After programming voltage is removed the floating gate remains charged. All other cells with low voltage on either gate or drain will not be affected; that is, if the X line 14 and Y line 17 are high while X line 15 and Y line 18 are low, the upper left cell 10 is programmed by charging its floating gate but the other three cells are not. The array is erased by ultraviolet light, or electrically as set forth in U.S. Pat. No. 4,122,544.

Turning now to FIGS. 4a-4e, a process for making the ROM array of the invention will be described. The right hand side of these FIGURES corresponds to the section view of FIG. 3a, while the left hand side shows the formation of an N-channel silicon gate transistor of conventional form on the periphery of the chip, i.e., not in the cell array. The starting material is a slice of P-type monocrystalline silicon, typically three or four inches in diameter and twenty mils thick, cut on the <100> plane, of a resistivity of about 6 to 8 ohm-cm. As mentioned above, in the FIGURES the portion shown of the bar 20 represents only a very small part of the slice, perhaps 1 or 2 mils wide. After appropriate cleaning, the slice is oxidized by exposing to oxygen in a furnace at an elevated temperature of perhaps 1100 Degrees C. to produce an oxide layer 31 over the entire slice of a thickness of about 1000 Angstroms. Parts of this layer 31 may stay in place to become the gate insulator areas 21, but usually the layer is later removed and new gate oxide grown. First, a boron implant is performed using a photoresist mask to create the P+ tanks20'. Next, a layer 32 of silicon nitride of about 1000 Angstroms thickness is formed over the entire slice by exposing to an atmosphere of dichloro silane and ammonia in a reactor. A coating of photoresist is applied to the entire top surface of the slice, then exposed to ultraviolet light through a mask which defines the desired pattern of the thick field oxide 24 and the P+ channel stop 25. The resist is developed, leaving areas where nitride is then etched away by a nitride etchant, removing the exposed part of the nitride layer 32 but leaving in place the oxide layer 31; the nitride etchant does not react with the photoresist.

Using photoresist and nitride as a mask, the slice is now subjected to an ion implant step to produce the channel stop regions 25, whereby boron atoms are introduced into unmasked regions 33 of silicon. The oxide layer 31 is left in place during the implant because it prevents the implanted boron atoms from out-diffusing from the surface during subsequent heat treatment. This implant is at a dosage of about $10^{13}$ per square cm at 150 KeV. The regions 33 do not exist in the same form in the finished device, because some of this part of the slice will have been consumed in the field oxidation procedure. Usually the slice would be subjected to a heat treatment after implant but prior to field oxide growth, as set forth in U.S. Pat. No. 4,055,444, assigned to Texas Instruments.

Figure 4A:
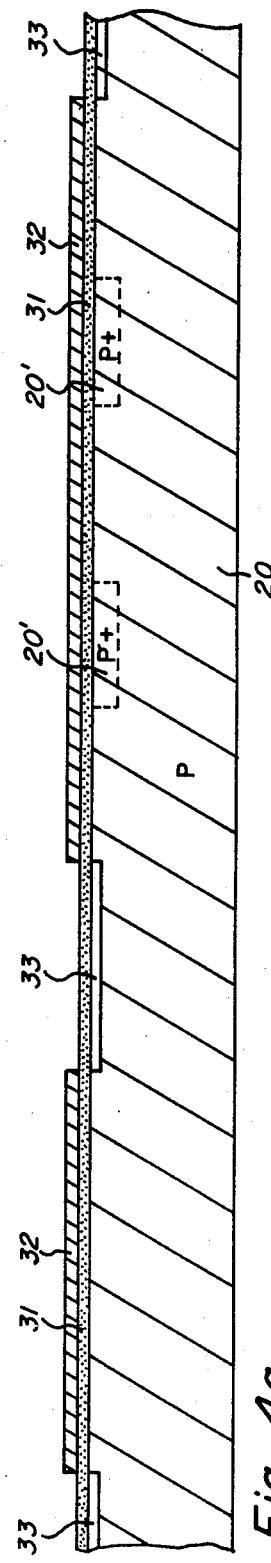
Figure 4B:
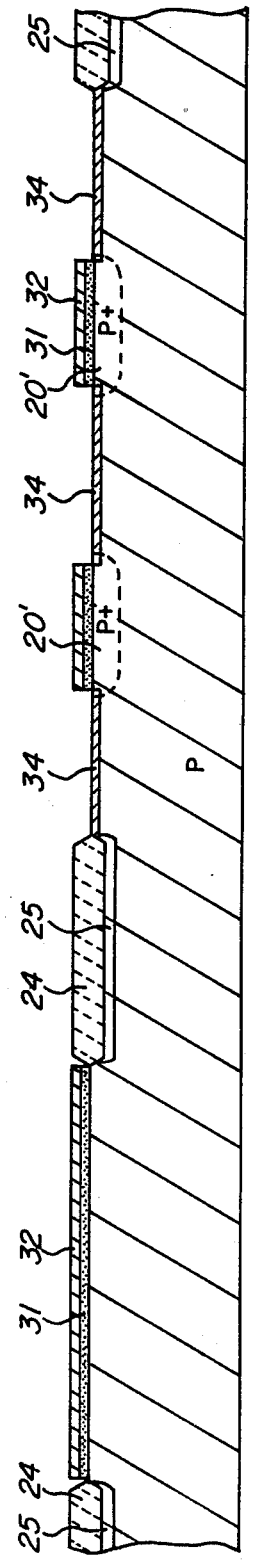

The next step in the process is the initial formation of field oxide 24, which is done by subjecting the slices to steam or an oxidizing atmosphere at about 900 to 1000 Degrees C. for several hours. This causes a thick field oxide region or layer 24 to be grown as seen in FIG. 4b. This region extends into the silicon surface because silicon is consumed as it oxidizes. The remaining parts of the nitride layer 32 mask oxidation. The thickness of this layer 24 is about 6000 Angstroms, about half of which is above the original surface and half below. The boron doped P+ regions 33 formed by implant will be partly consumed, but will also diffuse further into the silicon ahead of the oxidation front. Thus, P+ field stop regions 25 will result which will be much deeper than the original regions 33. At this point, the field oxide layer 24 is not nearly as thick as it will be in the finished device. Additional thickness results from subsequent heat treatments.

The slice is now coated with another photoresist layer and then exposed to ultraviolet light through a mask which defines the source and drain areas 12 and 13 as well as the lines 16, 17 and 18 which are to be N+ diffused. After developing the photoresist the slice is again subjected to a nitride etchant which removes the parts of the nitride layer 32 now exposed by holes in the photoresist. The parts of the oxide layer 31 exposed when this nitride is removed are then etched to expose bare silicon. A phosphorus diffusion produces the N+ regions 34 which will subsequently become the sources, drains, etc. Instead of diffusion, these N+ regions 34 may be formed by ion implant, in which case the oxide layer 31 would be left in place and an anneal step used before the subsequent oxidation.

Figure 4C:
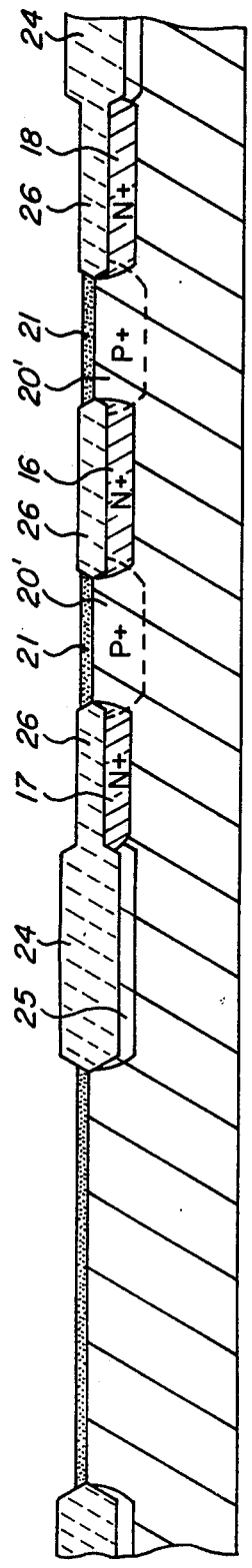

Referring to FIG. 4c, a second field oxidation step is now performed by placing the slice in steam or dry oxygen at about 1000 Degrees C. for several hours. This oxidizes all of the top of the slice not covered by the remaining parts of the nitride layer 32, producing field oxide 26 which is about 5000 Angstroms thickness. During this oxidation, the areas of field oxide 24 grow thicker, to perhaps 10,000 Angstroms. The N+ regions 34 are partly consumed but also diffuse further into the silicon ahead of the oxidation front to create the heavily doped regions 12, 13, 16, 17 and 18.

Next the remaining nitride layer 32 is removed by an etchant which attacks nitride but not silicon oxide, then the oxide 31 is removed by etching and the exposed silicon cleaned. The gate oxide 21 is grown by thermal oxidation to a thickness of about 500 to 800 Angstroms. In areas of the slice where depletion load devices are required, although not pertinent to this invention, a masked ion implant step would be done at this point. Likewise, the threshold voltage of the enhancement mode transistors in the EPROM array or periphery may be adjusted by ion implant. Also, windows for polysilicon to silicon contacts, if needed, are patterned and etched at this point using photoresist; none are needed in the EPROM array itself or the peripheral transistor shown.

Figure 4D:
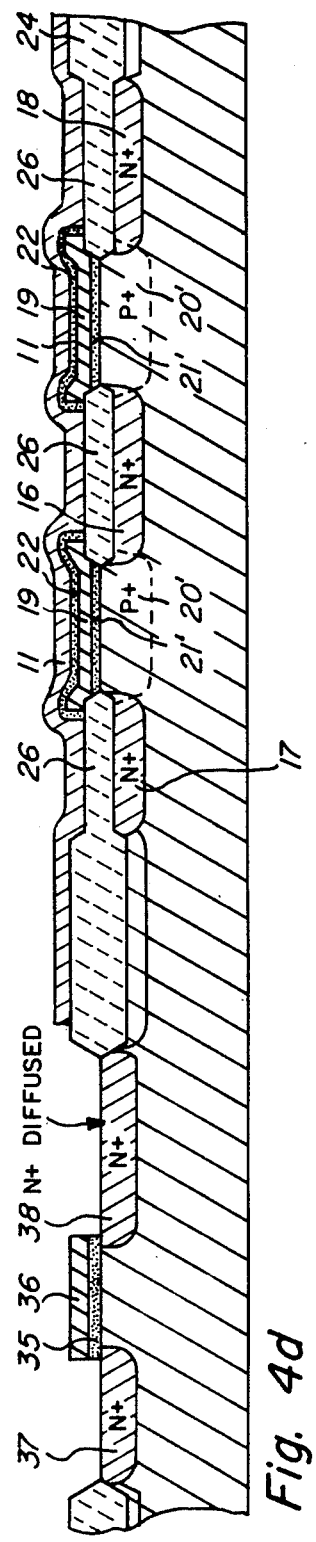

As seen in FIG. 4d a layer of polycrystalline silicon is deposited over the entire slice in a reactor using standard techniques to a thickness of about 5000 Angstroms. This layer is doped with phosphorus by an N+ diffusion on implant to make it highly conductive. This first level polysilicon layer is patterned by applying a layer of photoresist, exposing to ultraviolet light through a mask prepared for this purpose, developing, then etching both photoresist and exposed oxide. The remaining photoresist masks certain areas of the polysilicon to define the floating gates 19 in the EPROM array. The unmasked polycrystalline silicon is etched away, so the resulting structure seen in FIG. 4d includes a part of the remaining first level polysilicon layer which provides what will be the floating gates. The thin thermal oxide 21 underneath each gate 19 is the gate oxide of the memory cell transistor.

A part of the upper surface of the first level polysilicon is oxidized by exposing the slice to an oxidizing atmosphere at 900 to 1000 Degrees C. to create the thermal oxide layer 22 over the floating gates. The thickness of this layer is about 1000 Angstroms. At the same time a gate oxide layer 35 for a peripheral transistor may be formed. A second level of polycrystalline silicon is next deposited over the slice then masked by photoresist then etched to leave the address lines 14 and 15, the control gates 11, and a gate 36 for the peripheral transistor.

When the first level polysilicon is patterned the floating gates 19 are part of elongated strips of poly running parallel to the N+ regions 16, 17 and 18. Then, when the second level poly is patterned, parts of the first level poly are removed at the same time, so the edges of the floating gates 19 coincide with the edges of the address lines 14 and 15. This allows the cell size to be smaller because no excess overlap is needed to assure that the control gates completely cover the floating gates.

Figure 3A:
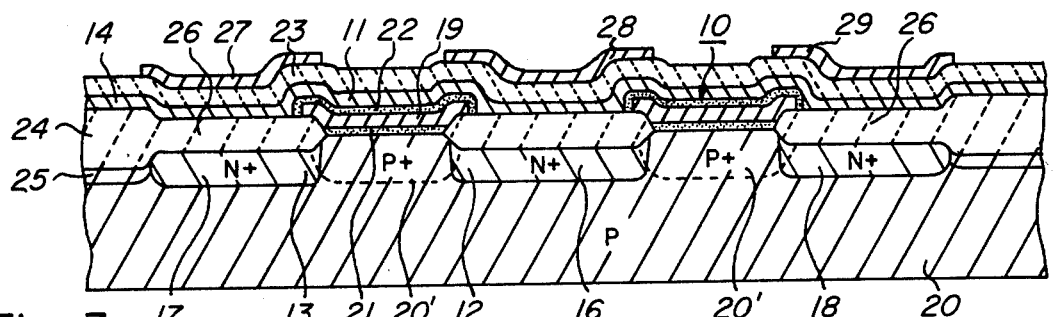
FIGS. 3a-3d are elevation views in section of the cell of FIG. 1, taken along the lines a—a, b—b, c—c, and d—d, respectively.
Figure 3B:
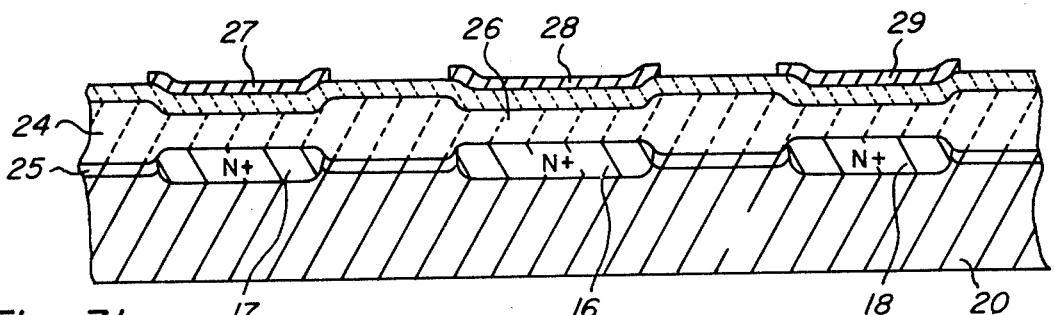
Figure 3C:
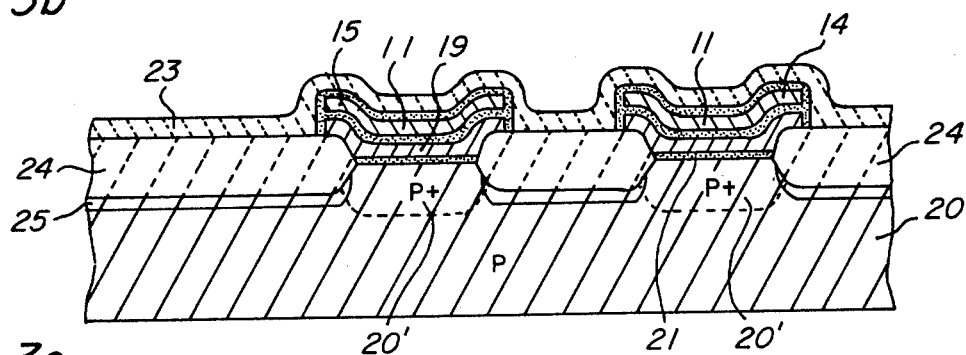
Figure 3D:
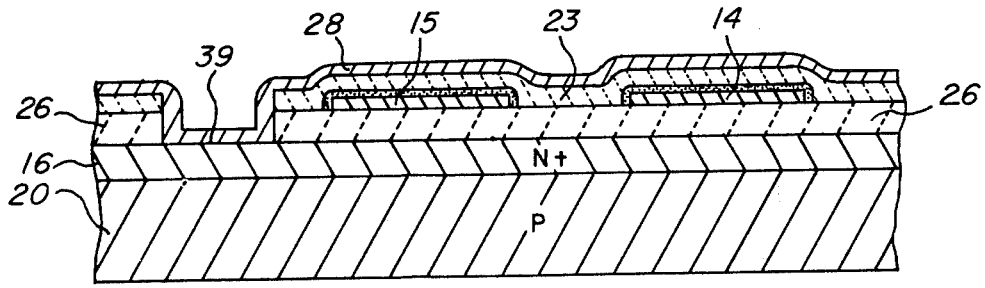

The overlap of the floating gates 19 over the source and drain regions 12 and 13 is non critical. Misalignment will not be catastrophic because if the edge of the floating gate falls short of the edge of the thick oxide 26 the device will still function. The critical edge is on the side, as seen in FIG. 3c; here the channel will always be covered due to the etching sequence.

The thin silicon oxide not covered by polysilicon is removed from the moat area of the peripheral circuitry and the slice is subjected to a phosphorus deposition and diffusion to create the N+ source and drain regions 37 and 38 for the peripheral transistor as well as various interconnections as seen in FIG. 4d.

A thick layer 23 of silicon oxide is deposited by decomposition of silane at a low temperature, about 400 Degrees C. This layer 23 insulates the metal level from the second level polycrystalline silicon, and is referred to as multilevel oxide.

Figure 4E:
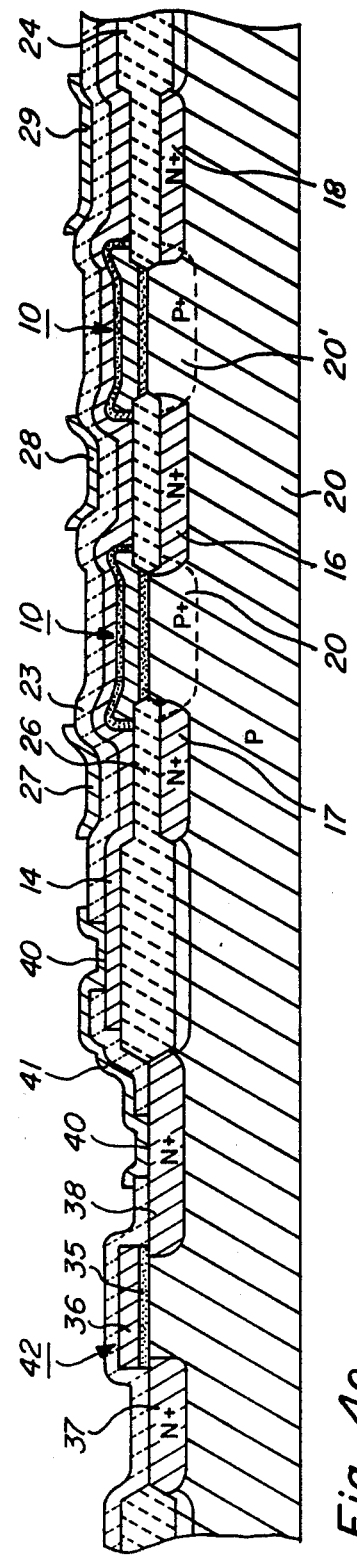

Referring to FIG. 4e, the multilevel oxide layer 23 is now patterned by a photoresist operation, exposing the contact areas 39 for metal-to-silicon contacts along the lines 27, 28 and 29 in the cell array and contact areas 40 for a metal-to-silicon or metal-to-poly contact for the peripheral transistor. These are of course merely illustrative; metal contacts and interconnections are used in the periphery of the chip in the input buffers, decoders, sense amplifiers, and the like, as well as for the bonding pads which provide connection to external electrodes. The metal contacts and interconnections are made in the usual manner by depositing a thin film of aluminum over the entire top surface of the slice then patterning it by a photoresist mask and etch sequence. This leaves a metal strip 41 connecting the source 38 of N-channel silicon gate transistor 42 to the contact area 40 at one end of the polysilicon X address line 14 as seen in FIG. 4e.

In a read operation, the X address selects one of the lines 14 or 15, or one of the other of the 256 such lines in a 64K ROM, and this selected line is held at logic 1 level or about +5 V. The remaining lines are held at Vss, logic 0. The Y address selects one of the 256 lines such as 17 and 18, and this line is connected via the Y decoder to the output. The Y lines usually would be precharged prior to an access cycle for a dynamic memory, so the selected line will conditionally discharge depending upon whether the selected cell 10 at the intersection of the addressed X and Y lines is programmed a 1 or a 0. Precharge is not necessary for a static memory.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A method of making an electrically programmable semiconductor memory cell of the floating gate type comprising the steps of:
   forming heavily-doped source and drain regions on opposite sides of a channel region in a face of a body of semiconductor material, the source and drain regions being elongated and parallel to each other and being covered with a field oxide,
   thereafter applying a first layer of conductive material on said face separated from the channel region by thin gate oxide much thinner than said field oxide,
   patterning the first layer to define a first set of elongated, parallel strips with each strip positioned between a pair of said source and drain regions and whose side edges define a first pair of opposite edges of a floating gate,
   then applying a second layer of conductive material on said face overlying the first layer separated therefrom by a thin insulator coating,
   and thereafter patterning the second layer to define a second set of parallel, elongated strips extending perpendicular to said other strips to define control gates and patterning exposed portions of said thin insulator coating and said first set of strips to define a second pair of opposite edges of the floating gate.

2. A method according to claim 1 wherein the semiconductor body is P-type silicon, the heavily doped regions are N+, and the conductive material is polycrystalline silicon.

3. A method of making a semiconductor device comprising the steps of:
   forming a plurality of parallel elongated heavily doped regions in a face of a semiconductor body with an insulating coating over the body,
   thereafter applying a first layer of conductive material over said face and patterning the first layer partly to form a plurality of elongated and parallel electrodes with each electrode being located between the heavily doped regions and also overlying the heavily doped regions by a significant amount,
   applying a second layer of conductive material on said face overlying the first layer insulated there from by an insulating layer,
   patterning the second layer to define a plurality of elongated strips perpendicular to the heavily doped regions and at the same time patterning the exposed portions of the insulating layer and the electrodes.

4. A method according to claim 3 wherein the conductive material is polycrystalline silicon.

5. A method according to claim 4 wherein the insulator under the electrodes is much thinner than said insulating coating over the edges.

6. A method according to claim 1 including the step of applying a third layer of conductive material to said face over the second layer but insulated therefrom, and patterning the third layer to define conductive strips overlying the source and drain regions.

7. A method according to claim 3 including the step of applying a third layer of conductive material on said face overlying the second layer but insulated therefrom, and patterning the third layer to form parallel elongated strips overlying said heavily doped regions.

* * * * *